(12) United States Patent
Fukuda et al.

(10) Patent No.: US 6,524,955 B2
(45) Date of Patent: Feb. 25, 2003

(54) METHOD OF FORMING THIN FILM ONTO SEMICONDUCTOR SUBSTRATE

(75) Inventors: Hideaki Fukuda, Tama (JP); Hiroki Arai, Tama (JP)

(73) Assignee: ASM Japan K.K., Tokyo (JP)

( * ) Notice: Subject to any disclaimer, the term of this patent is extended or adjusted under 35 U.S.C. 154(b) by 19 days.

(21) Appl. No.: 09/804,814

(22) Filed: Mar. 13, 2001

(65) Prior Publication Data

US 2001/0037769 A1 Nov. 8, 2001

(30) Foreign Application Priority Data

Mar. 27, 2000 (JP) ........................................ 2000-087530

(51) Int. Cl.[7] .............................................. H01L 21/44
(52) U.S. Cl. ........................ 438/680; 427/569; 427/573; 427/576
(58) Field of Search ................................. 438/680, 683, 438/685–687; 427/569, 576–579, 573

(56) References Cited

U.S. PATENT DOCUMENTS

| | | | | |
|---|---|---|---|---|
| 4,684,542 A | * | 8/1987 | Jasinski et al. | ............. 438/680 |
| 4,897,171 A | * | 1/1990 | Ohmi | .......................... 204/298 |
| 5,380,566 A | | 1/1995 | Robertson et al. | .......... 427/534 |
| 5,482,749 A | * | 1/1996 | Telford et al. | ............... 427/578 |
| 5,904,779 A | | 5/1999 | Dhindsa et al. | .............. 118/723 |
| 5,942,282 A | * | 8/1999 | Tada et al. | ................... 427/250 |
| 6,167,834 B1 | * | 1/2001 | Wang et al. | ............. 118/723 E |

FOREIGN PATENT DOCUMENTS

| | | |
|---|---|---|
| EP | 0 780 488 A1 | 6/1997 |
| JP | 03-44472 | 2/1991 |
| JP | 10-340896 | 12/1998 |
| JP | 11060356 | 3/1999 |

\* cited by examiner

Primary Examiner—Wael Fahmy
Assistant Examiner—Hsien Ming Lee
(74) Attorney, Agent, or Firm—Knobbe Martens Olson & Bear LLP

(57) ABSTRACT

In a plasma CVD apparatus including a reaction chamber and a susceptor to form a thin film on a semiconductor substrate, a pretreatment step is conducted to form a surface layer on the surface of the susceptor so that the surface layer can prevent the semiconductor substrate from electrostatically adhering to the surface of the susceptor. The pretreatment step includes steps of introducing into the reaction chamber a gas containing, the same gas as the gas for use in a film-forming treatment, and forming a surface layer on the susceptor surface by a CVD process.

14 Claims, 3 Drawing Sheets

D — Plasma treatment onto semiconductor substrate

RD — Antistatic treatment

C — Cleaning treatment inside treatment container

R — Treatment for forming adsorption preventive layer

| | Plasma treatment onto semiconductor substrate |
|---|---|
|  | |
| | Antistatic treatment |
|  | |
| | Cleaning treatment inside treatment container |
|  | |
| | Treatment for forming adsorption preventive layer |
|  | |

METHOD OF FORMING THIN FILM ONTO SEMICONDUCTOR SUBSTRATE

BACKGROUND OF THE INVENTION

1. Field of the Invention

The present invention relates to a method of forming a thin film onto a semiconductor substrate using a plasma CVD apparatus, particularly to a method of preventing the semiconductor substrate from being adsorbed on a susceptor.

2. Description of the Related Art

A plasma CVD apparatus has been heretofore generally used in order to form or remove a thin film or to modify the surface of a material to be treated. A basic technique of forming the thin film on a semiconductor substrate (e.g., silicon) or a glass substrate or etching the thin film is now indispensable especially for manufacturing memory chips or devices, CPUs or other semiconductor devices, or liquid crystal displays (LCD).

A plasma CVD process includes steps of introducing various material gasses into an evacuated reaction container, applying a radio-frequency power to the container to generate a plasma therein, and forming various thin films on the semiconductor substrate.

The plasma CVD apparatus generally constitutes a reaction chamber, an upper radio-frequency electrode (showerhead) which also serves as a gas dispersion plate for uniformly distributing the reaction gas, and a lower radio-frequency electrode which also serves as a susceptor for holding the semiconductor. The reaction chamber is connected to a transfer chamber via a gate valve. A conveying robot for conveying the semiconductor substrate into or out of the reaction chamber is installed inside the, transfer chamber. At least three lift pins are vertically passed through the susceptor. As the susceptor moves downward, these lift pins push up the semiconductor substrate placed on the susceptor.

In general, the conveying robot conveys a semiconductor substrate onto a susceptor from which the lift pins project, and slowly places the semiconductor substrate on the lift pins. Thereafter, when the susceptor moves upward and the lift pins move downward with respect to the susceptor, the semiconductor substrate is held on the surface of the susceptor, thereby starting a film-forming treatment. When the film-forming treatment ends, the susceptor moves downward, and the lift pins projecting from the susceptor detach the semiconductor substrate from the susceptor to hold the semiconductor substrate in mid-air. Finally, the conveying robot conveys the treated semiconductor substrate to the transfer chamber from the reaction chamber.

Usually, the semiconductor substrate subjected to plasma treatment is electrostatically charged with plasma and electrostatically attracted to the surface of the susceptor. If the electrostatically adsorbed semiconductor substrate is forcibly detached from the susceptor by the lift pins, the position of the semiconductor substrate shifts due to impact during detachment, and the semiconductor substrate cannot automatically be conveyed by the conveying robot. Moreover, if the impact is too strong, the semiconductor substrate is sometimes broken.

A method of preventing an error from being caused during conveyance or preventing a semiconductor substrate from breaking is disclosed, for example, in Japanese Patent No. 2890494 and U.S. Pat. No. 5,380,566. The disclosed method includes steps of interrupting a material gas, which contributes to film formation, immediately after completing film-forming treatment using plasma, thereby stopping film growth, and gradually lowering radio-frequency power to reduce the charge of the semiconductor substrate. Another method of preventing conveyance errors or semiconductor substrate breakage is disclosed in Japanese Patent Application Laid-Open No. 340896/1998 in which the susceptor surface is provided with irregularities and the contact area between the semiconductor substrate and the susceptor surface is reduced to prevent the semiconductor substrate from being attracted to the surface of the susceptor.

On the other hand, with enhancement of the density of a semiconductor device, there has been a necessity of preventing metal contamination from being caused by a metallic susceptor or a heater. To solve this problem, a ceramic heater has been proposed. The heater is manufactured of alumina ceramic ($Al_2O_3$) or aluminum nitride (AlN) which has a resistance to the plasma, so that impurity contamination is reduced. The ceramic heater also serves as the susceptor for directly holding the semiconductor substrate, and a resistance heating wire and a radio-frequency electrode are embedded in the heater. The radio-frequency electrode is embedded at a depth of several hundreds to several thousands of micrometers from the surface of the heater which directly contacts the semiconductor substrate.

SUMMARY OF THE INVENTION

However, when such a heater is used, the semiconductor substrate is strongly electrostatically attracted to the susceptor, and the conveyance error frequently occurs. In this case, in the method of gradually lowering the radio-frequency power as disclosed in the Japanese Pat. No. 2890494 and U.S. Pat. No. 5,380,566, the charge of the semiconductor substrate cannot sufficiently be decreased. Moreover, it has also been found out that even in the method of providing the irregularities on the susceptor surface as disclosed in the Japanese Patent Application Laid-Open No. 340896/1998, the adsorption of the semiconductor substrate on the susceptor cannot sufficiently be prevented.

Furthermore, the method of gradually lowering radio-frequency power as disclosed in the Japanese Patent No. 2890494 and U.S. Pat. No. 5380566 has a disadvantage that productivity decreases with a lapse of time which does not contribute to the film formation.

Therefore, an object of the present invention is to provide a method of forming a thin film on a semiconductor substrate, so that a semiconductor substrate is not attracted to a susceptor surface and no conveyance error occurs.

Another object of the present invention is to provide a method of forming a thin film on a semiconductor substrate with little impurity contamination.

A further object of the present invention is to provide a method of forming with high productivity a thin film on a semiconductor substrate.

To achieve the aforementioned objects, the present invention includes a method of using a plasma CVD apparatus comprising a reaction chamber and a susceptor to form a thin film on a semiconductor substrate, wherein the method comprises a pretreatment step of forming a surface layer on the susceptor, so that electrostatic adsorption of the semiconductor substrate on the susceptor is prevented by the surface layer.

The pretreatment step preferably comprises the steps of: introducing into the reaction chamber a gas containing the same gas as that for use in a film-forming treatment in which the thin film is formed on the semiconductor substrate into the reaction chamber; and forming the surface layer on the surface of the susceptor by a CVD process.

The pretreatment step may preferably be executed in the reaction chamber immediately before subjecting at least one semiconductor substrate to a film-forming treatment.

Moreover, the pretreatment step may preferably be executed every time a cleaning sequence in the reaction chamber ends.

The surface layer may be formed of a material lower in resistivity than the susceptor surface, specifically a material whose electric resistivity is $10^{-5}$ times or less that of the susceptor surface.

Specifically, the surface layer may be formed of a material selected from the group consisting of amorphous silicon, polysilicon, silicon carbide, tungsten, tungsten nitride, tantalum, and tantalum nitride.

For purposes of summarizing the invention and the advantages achieved over the prior art, certain objects and advantages of the invention have been described above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention.

DETAILED DESCRIPTION OF THE PREFERRED EMBODIMENTS

An embodiment of the present invention will be described hereinafter with reference to the accompanying drawings.

Figure 1:
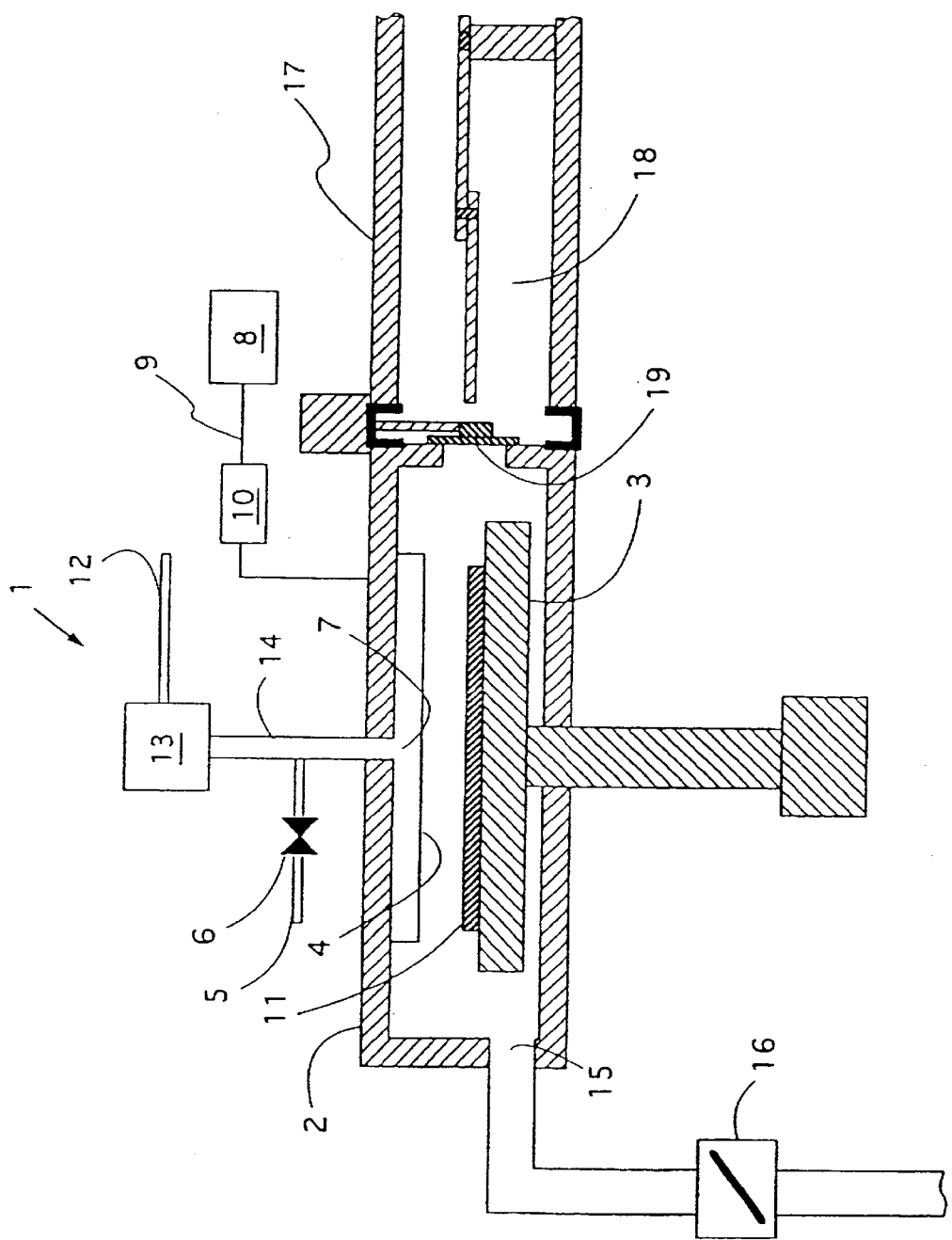
FIG. 1 is a schematic sectional view of a plasma CVD apparatus for executing a method included in the present invention.

FIG. 1 is a schematic diagram of a parallel flat plate type plasma CVD apparatus for executing a method included in the present invention. A plasma CVD apparatus 1 constitutes a reaction chamber 2, a susceptor 3 disposed inside the reaction chamber 2, and a shower head 4 disposed opposite to the susceptor 3 in the reaction chamber 2. The reaction chamber 2 is connected to a transfer chamber 17 via a gate valve 19. A conveying robot 18 for conveying a semiconductor substrate 11 into or out of the reaction chamber 2 is installed in the transfer chamber 17. The reaction chamber 2 is also provided with an exhaust port 15, and the exhaust port 15 is connected to an, external vacuum exhaust pump (not shown) via a conductance adjustment valve 16. The showerhead 4 is connected to a remote plasma discharge apparatus 13 via a piping 14. A cleaning gas bomb (not shown) is connected to the remote plasma discharge apparatus 13 via a piping 12. A reaction gas bomb (not shown) is connected to the piping 14 via a piping 5 and valve 6. A radio-frequency transmitter 8 is connected to the showerhead 4 via an output cable 9 and rectification circuit 10.

Figure 2A:
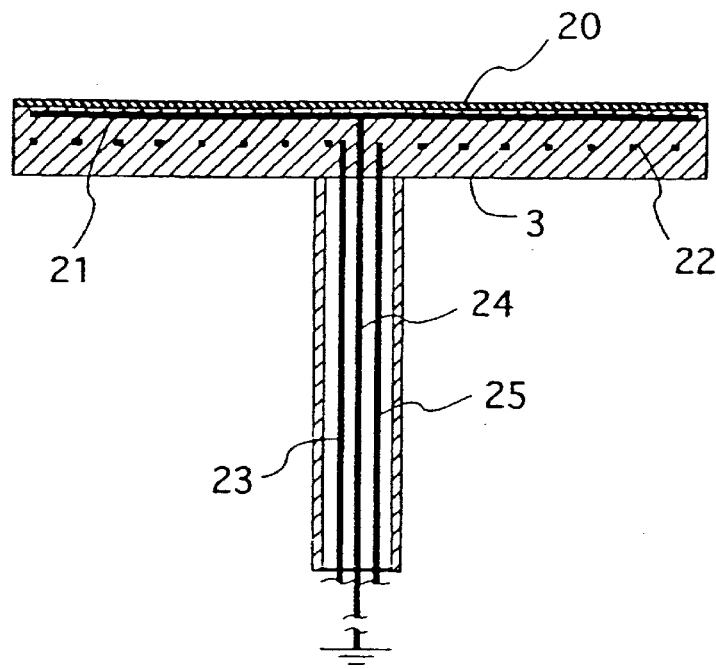
FIG. 2A is an enlarged vertically sectional view of a susceptor of FIG. 1.
Figure 2B:
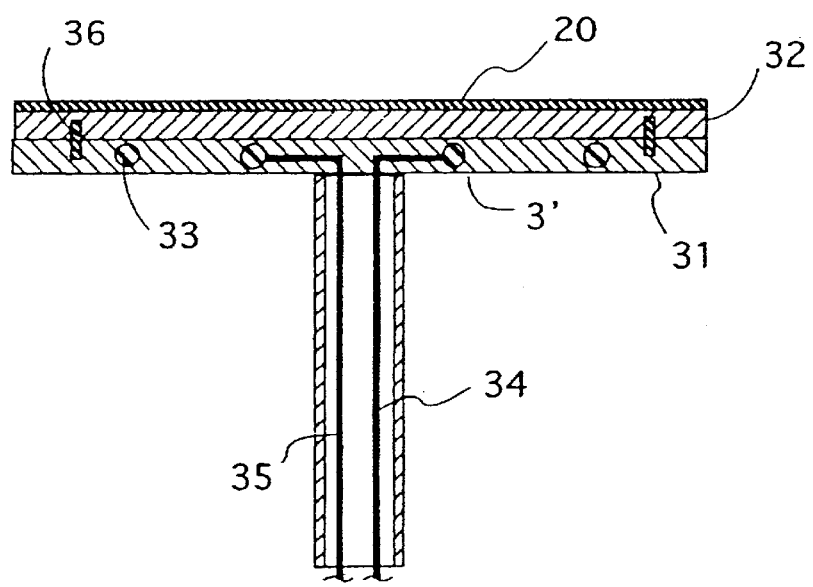
FIG. 2B shows a modification example of the susceptor.

FIG. 2A is an enlarged vertically sectional view of the susceptor 3. The susceptor 3 is formed of a ceramic cylindrical block of AlN, $Al_2O_3$, or the like. An RF electrode 21 and resistance-heating element 22 are embedded in the susceptor 3. The RF electrode 21 is electrically grounded via a metal rod 24. The resistance heating element 22 is connected to metal rods 23, 25, and AC power is applied to between the opposite rods. FIG. 2B is a vertically sectional view showing a modification example of the susceptor 3, that is, a susceptor formed of an aluminum alloy which has heretofore been used. A susceptor 3' is a separation type susceptor in which a susceptor top plate 32 with an anodized Al alloy surface is fixed to a cylindrical heater block 31 of an Al alloy (e.g., A6061) via a screw 36. A resistance heating element 33 is embedded in the heater block 31, and AC power is applied to opposite ends 34, 35 of the resistance heating element.

A method of forming a thin film using the plasma CVD apparatus 1 will be described. First, the reaction chamber 2 and transfer chamber 17 are evacuated by the external vacuum pump. Next, the gate valve 19 is opened, and the conveying robot 18 lays the semiconductor substrate 11 onto the susceptor 3 which is held at reaction temperature in a range of 300° C. to 650° C. A reaction gas for forming the thin film on the surface of the semiconductor substrate 11 is controlled by a mass flow controller (not shown), so that the reaction gas is supplied at a predetermined flow rate into the shower head 4 via the piping 5, the valve 6, and an upper opening 7 of the reaction chamber 2. The reaction gas is uniformly jetted toward the semiconductor substrate 11 from the showerhead 4. The pressure inside the reaction chamber 2 is adjusted in a range of 0.5 Torr to 10 Torr by controlling an opening degree of the conductance adjustment valve 16. Subsequently, an RF power from the radio-frequency transmitter 8 is applied to between opposite electrodes of the showerhead and susceptor. The reaction gas of a space between the opposite electrodes is ionized by an RF energy, and a plasma state is generated. A chemical reaction occurs in the vicinity of the semiconductor substrate 11, and various thin films are formed in accordance with the reaction gas. After a thin film treatment ends, the reaction chamber 2 is evacuated, the gate valve 19 opens, and the conveying robot 18 conveys the semiconductor substrate 11 out of the reaction chamber 2.

A method of performing remote reactor cleaning (e.g., plasma cleaning) will next be described. After the desired number of substrates are subjected to the thin film treatment, the gate valve 19 and valve 6 are closed. A cleaning gas (e.g., $C_2F_6+O_2$, $NF_3+Ar$), whose flow rate is controlled to a predetermined flow rate, is introduced to the remote plasma discharge apparatus 13 through the piping 12. The cleaning gas is activated by the remote plasma discharge apparatus 13 and introduced through the opening 7 via the piping 14. The activated cleaning gas is uniformly supplied into the reaction chamber 2 via the showerhead 4 from the opening 7. For the cleaning of the inner surface of a treatment container, a radio-frequency power source and radio-frequency electrode for use in a treatment for forming the thin film onto the semiconductor substrate may be used to perform an in-situ cleaning process.

According to an embodiment of the present invention, the method of using the plasma CVD apparatus including the reaction chamber and susceptor to form the thin film on the semiconductor substrate includes a pretreatment step of forming a surface layer 20 on the susceptor, so that electrostatic adsorption of the semiconductor substrate on the susceptor is eliminated by the surface layer 20. The surface layer 20 has a function of preventing the electrostatic adsorption of the semiconductor substrate 11 on the susceptor 3. The surface layer 20 is directly formed on the surface of the susceptor before subjecting the surface of the semiconductor substrate 11 to the film-forming treatment. Specifically, the pretreatment step is executed while the semiconductor substrate 11 disposed in the atmosphere is introduced into a load lock chamber (not shown) to be conveyed to the vacuum transfer chamber 17. Therefore, the pretreatment step exerts no substantial influence on productivity of the plasma CVD apparatus 1.

In an embodiment, the pretreatment step includes steps of: introducing into the reaction chamber 2 a gas containing the same gas as that for use in the treatment for forming the thin film on the semiconductor substrate; and forming the surface layer on the surface of the susceptor 3 by a plasma CVD process. For example, when an amorphous silicon film is formed as the surface layer, $SiH_4$ or $Si_{2H6}$ is used as a material gas with Ar, He, $N_2$, and the like. Moreover, when a silicon carbide (SiC) film is formed as the surface layer, $SiH(CH_3)_3$ and He are used as the material gas. Since the same gas as that for use in the film-forming treatment on the semiconductor substrate is used, it is unnecessary to add a gas system to the apparatus, which is economical. These material gases are used to directly form the surface layer 20 on the susceptor 3 by a thin film-forming process using the plasma CVD apparatus 1. The gas introduced into the reaction chamber 2 need not be the same gas as that for use in film formation on the semiconductor substrate. The gas can be selected independently of subsequent film formation treatment, as long as a surface layer having the characteristics described below can be formed on the susceptor.

The surface layer 20 has an electric resistivity lower than that of the base material of the susceptor 3. Preferably, the surface layer has an electric resistivity of $1-10^{10}$ $\Omega \cdot cm$. Further, the surface layer 20 preferably has an electric resistivity lower than that of the base material of the susceptor 3 by a factor of $10^{-5}$ times or less. Specifically, the surface layer 20 is formed of an amorphous silicon film, a silicon carbide film, a polysilicon film or another semiconductor film, or a tungsten film, a tungsten nitride film, a tantalum film, a tantalum nitride film or another conductive film. The surface layer may have a thickness of 5–300 nm.

The surface layer can be formed based on film formation processes. That is, in an embodiment, the conditions for surface layer formation may be as follows: A material gas at 10–500 sccm, a carrier gas at 500–5,000 sccm, a heater temperature of 300–650° C., a pressure of 0.5–10 Torr, and an RF power of 50–400 W. The surface layer can be formed very efficiently; that is, no additional time may be required.

Figure 3:
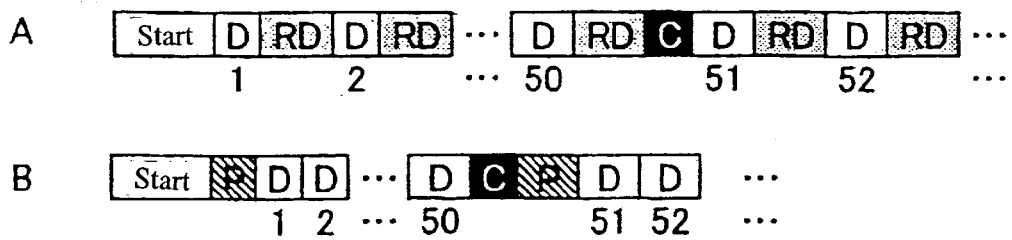
FIG. 3 shows (A) a conventional plasma CVD sequence, and (B) a plasma CVD sequence of the present invention, respectively.
Figure 3:
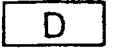
Figure 3:
Figure 3:
Figure 3:

FIGS. 3A and 3B show a conventional plasma CVD sequence, and a plasma CVD sequence of an embodiment of the present invention, respectively.

In the conventional sequence of FIG. 3A, when operation of the plasma CVD apparatus begins, first a plasma treatment is performed on a first semiconductor substrate. Subsequently, an antistatic treatment is performed. Specifically, immediately after the film-forming treatment onto the semiconductor substrate, a radio-frequency power is gradually reduced, and the charge of the semiconductor substrate is decreased. This antistatic treatment is performed after each film-forming treatment. In the example of FIG. 3A, after 50 semiconductor substrates are subjected to the film-forming treatment and antistatic treatment, a cleaning treatment is executed.

In the sequence according to an embodiment of the present invention shown in FIG. 3B, when operation of the plasma CVD apparatus begins, a pretreatment for forming the adsorption preventing surface layer 20 is performed prior to the semiconductor substrate treatment. The time required for forming a surface layer may be 2–60 seconds. Surface layer formation can be complete while semiconductor substrates are being loaded in a vacuum chamber, and thus no additional time may be required. Subsequently, 50 semiconductor substrates are subjected to the film-forming treatment. Thereafter, the cleaning treatment is performed, and an unnecessary material adhering to a treatment container and susceptor surface layer 20 (e.g., amorphous silicon film) is removed. Therefore, the surface layer 20 needs to be formed after each cleaning treatment ends.

According to an embodiment of the present invention, in contrast to the prior art, it is unnecessary to perform the antistatic treatment for each film-forming treatment. Therefore, if the antistatic treatment takes 15 to 30 seconds, a treatment time for 50 semiconductor substrates is shortened by approximately 12 to 25 minutes, and productivity of the plasma treatment apparatus is enhanced.

EXAMPLES

Examples of the present invention were compared with comparative examples as conventional methods with respect to occurrence of adsorption of the semiconductor substrate and a degree of metal contamination on the semiconductor substrate. In the following examples and comparative examples, Eagle 10 manufactured by Nihon ASM Co., Ltd. was used as the plasma CVD apparatus.

1. Comparative Example 1

In a heater of AlN ceramic with an electric resistivity of $10^{15}$ $\Omega \cdot cm$, no adsorption preventive layer was formed.

2. Example 1

An SiC film having an electric resistivity of 50 $\Omega \cdot cm$ was formed by about 10 nm in the AlN ceramic heater having the electric resistivity of $10^{15}$ $\Omega \cdot cm$.

Adsorption Preventive Layer Forming Conditions $SiH(CH_3)_3$: 100 sccm
He: 1000 sccm
Heater temperature: 550° C.
Pressure: 6 Torr
Radio-frequency power: 600 W
Distance between electrodes: 14 mm
Film-forming time*: 10 seconds

*For the film-forming time, an adsorption preventing effect was confirmed in a range of seven seconds or more (film thickness of about 7 nm or more). Additionally, it is preferable to form the adsorption preventive layer while the semiconductor substrate is introduced into the vacuum transfer chamber. Therefore, the film-forming time is preferably 60 seconds or less.

3. Example 2

An amorphous silicon film having an electric resistivity of $10^9$ $\Omega \cdot cm$ was formed by about 17 rum in the AlN ceramic heater having an electric resistivity of $10^{15}$ $\Omega \cdot cm$.

Adsorption Preventive Layer Forming Conditions $SiH_4$: 100 sccm
Ar: 1000 sccm

Heater temperature: 550° C.
Pressure: 3.5 Torr
Radio-frequency power: 300 W
Distance between electrodes: 14 mm
Film-forming time*: 5 seconds

*For the film-forming time, the adsorption preventing effect was confirmed in a range of three seconds or more (film thickness of about 10 nm or more). Additionally, it is preferable to form the adsorption preventive layer while the semiconductor substrate is introduced into the vacuum transfer chamber. Therefore, the film-forming time is preferably 60 seconds or less.

4. Plasma Treatment on Semiconductor Substrate of Comparative Example 1 and Examples 1 and 2

A plasma silicon nitride film (P-SiN) was formed on the semiconductor substrate to a thickness of approximately 50 nm.

Film-forming Conditions

Number of treated semiconductor substrates: 25 substrates
$SiH_4$: 30 sccm
$N_2$: 5000 sccm
Heater temperature: 550° C.
Pressure: 4.25 Torr
Radio-frequency power: 400 W
Distance between electrodes: 14 mm
Film-forming time: 30 seconds

5. Conventional Example 2

An anodized film having an electric resistivity of $10^{15} \Omega \cdot cm$ was formed to a thickness of 20 μm on an Al alloy.(JIS: A5052) surface of the susceptor without any adsorption preventive layer formed thereon.

6. Example 3

An anodized film having an electric resistivity of $10^{15} \Omega \cdot cm$ was formed on the Al alloy (JIS: A5052) surface of the susceptor to a thickness of 20 μm, and an amorphous silicon film having an electric resistivity of $10^9 \Omega \cdot cm$ was further formed on the susceptor to a thickness of approximately 20 nm.

Adsorption Preventive Layer Forming Conditions $SiH_4$: 100 sccm
Ar: 1000 sccm
Heater temperature: 420° C.
Pressure: 3.5 Torr
Radio-frequency power: 300 W
Distance between electrodes: 14 mm
Film-forming time*: 5 seconds

*For the film-forming time, the adsorption preventive effect was confirmed in a range of 2.5 seconds or more (film thickness of about 10 nm or more). Additionally, it is preferable to form the adsorption preventive layer while the semiconductor substrate is introduced into the vacuum transfer chamber. Therefore, the film-forming time is preferably 60 seconds or less.

7. Plasma Treatment onto Semiconductor Substrate of Comparative Example 2 and Example 3

A plasma silicon nitride film (P-SiN) was formed to a thickness, of approximately 500 nm on the semiconductor substrate.

Film-forming Conditions $SiH_4$: 215 sccm
$NH_3$: 1000 sccm
$N_2$: 600 sccm
Heater temperature: 420° C.
Pressure: 3.75 Torr
Radio-frequency power: 500 W
Distance between electrodes: 10 mm
Film-forming time: 50 seconds

8. Measuring Method (1) Occurrence of Electrostatic Adsorption:
A jump of the semiconductor substrate is visually observed when the susceptor is separated from the semiconductor substrate by the lift pins.
(2) Degree of Metal Contamination on Semiconductor Substrate:
Using an inductive coupling plasma mass analyzing method, Cr, Fe, Cu, Mg, Ni metal atomic number surface density was measured.

9. Measurement Result

Measurement results are shown in Table 1.

TABLE 1

|  | Comparative Example 1 | Ex. 1 | Ex. 2 | Comp. Ex. 2 | Ex. 3 |
|---|---|---|---|---|---|
| Susceptor | AlN | AlN | AlN | Al alloy | Al alloy |
| Adsorption preventive layer (film thickness) | None | SiC (10 nm) | α-Si (17 nm) | None | α-Si (20 nm) |
| Surface resistivity (Ω · cm) (room temperature) | 1.0E + 15 (AlN mother material) | 50 | 1.0E + 09 | 1.0E + 15 (Anodized film) | 1.0E + 09 |
| Electrostatic adsorption | Occurred | None | None | Occurred | None |
| Cr, Cu, Fe, Mg, Ni, metal atom surface density ($10^{11}$ atoms/$cm^2$) | 2.9 | 1.4 | 1.0 | 63 | 11 |

(1) Occurrence of Adsorption:
In Comparative Examples 1 and 2, electrostatic adsorption occurred, and the semiconductor substrate jumped each time the semiconductor substrate was thrust upward by the lift pins. In Examples 1, 2 and 3, a jump of the semiconductor substrate was not observed, and no conveyance error occurred.

(2) Degree of Metal Contamination on Semiconductor Substrate:
The metal atomic number surface density of Comparative Example 1 was compared with that of Examples 1 and 2. In these examples, the AlN susceptor was used. In this case, it was found that the density of Example 1 was reduced to approximately ½, and the density of Example 2 was reduced to approximately ⅓ as compared with Comparative Example 1. Moreover, the density of Comparative Example 2 was compared with that of Example 3. In these examples, the Al alloy susceptor 3' was used. In this case, it was found that the density of Example 3 was reduced to ⅙ as compared with Comparative Example 2. This is believed to be because the surfaces of the susceptor and upper radio-frequency electrode, as metal contamination sources existing in the reaction chamber, are covered with the adsorption preventive layers.

Effects of the Invention

According to an embodiment of the present invention, in the method of using the plasma CVD apparatus to form the desired thin film on the semiconductor substrate, the adsorption of the semiconductor substrate on the susceptor surface can completely be prevented from occurring during film formation. As a result, no error is produced during conveying of the semiconductor substrate, and a stable apparatus and process can be realized.

Moreover, according to an embodiment of the present invention, metal contamination on the semiconductor substrate can be reduced as compared with the conventional art. As a result, yield of a high quality semiconductor apparatus is enhanced.

Furthermore, according to an embodiment of the present invention, the pretreatment process is conducted while the semiconductor substrate is conveyed into the transfer chamber. Additionally, in contrast with the conventional methods, antistatic treatment for each film-forming treatment is unnecessary. Therefore, the treatment time per semiconductor substrate can be shortened considerably. As a result, productivity of the apparatus is enhanced.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A method for forming a thin film on a semiconductor substrate using a plasma CVD apparatus, comprising the steps of:
    forming by plasma reaction a surface layer having a thickness of no less than 5 nm but less than 20 nm on a susceptor in a reaction chamber of the plasma CVD apparatus to prevent static adhesion between the susceptor and a semiconductor substrate to be placed thereon, said surface layer having an electric resistivity lower than the electric resistivity of the susceptor surface and being removal by reactor cleaning; and
    forming by plasma reaction a thin film on a semiconductor substrate placed on the susceptor having the surface layer, followed by unloading the thin film-formed semiconductor substrate from the reaction chamber.

2. The method according to claim 1, wherein the electric resistivity of the surface layer is lower than that of the susceptor surface by a factor of equal to or less than $10^{-5}$.

3. The method according to claim 1, wherein the surface layer has an electric resistivity of $1-10^{10}$ Ω·cm.

4. The method according to claim 1, wherein the surface layer is formed of a material selected from the group consisting of amorphous silicon, polysilicon, silicon carbide, tungsten, tungsten nitride, tantalum, and tantalum nitride.

5. The method according to claim 1, wherein gas used in the step of surface layer formation is the same type of gas used in the step of thin film formation on the semiconductor substrate.

6. The method according to claim 1, further comprising conducting reactor cleaning after the step of thin film formation to clean the inner surface of the reaction chamber and to remove the surface layer.

7. The method according to claim 6, wherein multiple substrates are processed between the step of surface layer formation and the step of reactor cleaning.

8. The method according to claim 7, wherein the step of surface layer formation, the step of thin film formation, and the step of reactor cleaning are repeated in sequence.

9. A method for forming a thin film on a semiconductor substrate using a plasma CVD apparatus, comprising the steps of:
    loading semiconductor substrates upstream of a reaction chamber of the plasma CVD apparatus;
    forming by plasma reaction a surface layer on a susceptor in the reaction chamber to prevent static adhesion between the susceptor and a semiconductor substrate to be placed thereon, said surface layer having an electric resistivity lower than the electric resistivity of the susceptor surface and being removal by reactor cleaning;
    loading therefrom a semiconductor substrate to the reaction chamber; and
    forming by plasma reaction a thin film on the semiconductor substrate placed on the susceptor having the surface layer, followed by unloading the thin film-formed semiconductor substrate from the reaction chamber.

10. The method according to claim 9, wherein the surface layer has a thickness of 5–300 nm.

11. The method according to claim 9, wherein the electric resistivity of the surface layer is lower than that of the susceptor surface by a factor of equal to or less than $10^{-5}$.

12. The method according to claim 9, wherein the surface layer has an electric resistivity of $1-10^{9}$ Ω·cm.

13. The method according to claim 9, wherein the surface layer has a thickness of no less than 5 nm but less than 20 nm.

14. The method according to claim 9, wherein the surface layer is formed of a material selected from the group consisting of amorphous silicon, polysilicon, and silicon carbide.

* * * * *